United States Patent [19]

McCarty

[11] Patent Number: 4,553,315
[45] Date of Patent: Nov. 19, 1985

[54] N CONTACT COMPENSATION TECHNIQUE
[75] Inventor: Chris McCarty, Melbourne, Fla.
[73] Assignee: Harris Corporation, Melbourne, Fla.
[21] Appl. No.: 597,060
[22] Filed: Apr. 5, 1984
[51] Int. Cl.[4] .................. H01L 21/265; H01L 21/28
[52] U.S. Cl. .................................. 29/571; 29/576 B;
  29/578; 29/576 W; 29/580; 29/591; 148/1.5;
  148/187; 148/188; 148/DIG. 83; 357/44;
  357/65
[58] Field of Search .................... 29/571, 576 B, 578,
  29/576 W, 580, 579, 591; 148/1.5, 187, 188,
  DIG. 83; 357/41, 44, 59, 65

[56] References Cited
U.S. PATENT DOCUMENTS
3,984,822 10/1976 Simko et al. .................... 340/173 R 4,084,311 5/1978 Yasuoka et al. ...................... 29/571
4,109,371 8/1978 Shibata et al. ........................ 29/571
4,160,683 7/1979 Roche ................................. 148/187
4,161,417 7/1979 Yin et al. ........................... 29/571 X
4,433,468 2/1984 Kawamata ............................ 29/571
4,463,492 8/1984 Maeguchi ......................... 29/571 X Primary Examiner—Brian E. Hearn
Assistant Examiner—David A. Hey
Attorney, Agent, or Firm—Barnes & Thornburg

[57] ABSTRACT

The contact for N channel devices in a CMOS process is formed by ion implanting N-type impurities through contact apertures in the dielectric layer to a depth less than the source and drain regions and a layer of conductive material is applied without intermediate etching and delineated.

7 Claims, 4 Drawing Figures

4,553,315

N CONTACT COMPENSATION TECHNIQUE

BACKGROUND AND SUMMARY OF THE INVENTION

The present invention relates generally to insulated gate field effect transistors and more specifically to an improved method of forming contacts compatible with complementary insulated gate field effect transistors fabrication methods.

For high performance, short channel field effect transistors, the source and drain regions are formed to have shallow junctions. Contact metals to the source and drain regions, for example, aluminum, can touch the edges of the shallow N-type source and drain regions and short to the P-type body. Thus, the lateral area of the N-type source and drain regions has to be sufficiently large to allow accurate placement of the aluminum contact metal substantially centered on the portions of the source and drain regions having a concentration sufficient to prevent aluminum contact of the P-type body.

For source and drain regions having a depth of under 0.1 microns, it has been suggested to make the contact to source and drain regions having a greater depth and displaced from the channel region. Because of the limitation of mask superimposing accuracy and the pattern size accuracy, there has been difficulty in locating the contact apertures over the appropriate region. Thus, the regions have been formed oversized. To solve this problem in the shallow junction MOS devices, it has been suggested by Shibata et al in U.S. Pat. No. 4,109,371 to form the deep source and drain contact regions through the contact aperture. The formation of the deep source and drain regions. generally include high temperature steps which may effect the optimized performance of the MOS device. Similar in CMOS processing, the introduction of high impurity concentration N conductivity type impurities will substantially effect the P source and drain regions requiring additional processing steps and considerations.

Thus there exists the need for a method of fabricating contacts to CMOS devices which allows reduction in the overall size of the device to increase density as well as being compatible with the CMOS processes.

The present invention overcomes the problems of the prior art by using ion implantation and low temperature activation of N-type impurities into the N-type source and drain contact areas after the formation of contact apertures through the dielectric layer which covers the substrate including the field oxide. The region formed is shallower in depth than the source and drain regions and is followed by application of conductive material, preferably aluminum, and delineation to form interconnects. If the ion implantation is formed while both the P and N source and drain regions are exposed, the implantation would introduce impurities having a concentration greater than the P body region and less than the P+ source and drain regions. Alternatively, a low temperature mask may be formed over the P source and drain regions and the N-type impurities are ion implanted in only the N-type source and drain regions. The CMOS process includes forming the field oxide by local oxidation process and the outer edge of the source and drain regions are formed aligned with the edge of the field oxide, with the depth of the field oxide exceeding the depth of the source and drain regions.

Other objects, advantages and novel features of the present invention will become apparent from the following detailed description of the invention when considered in conjunction with the accompanying drawings.

DETAILED DESCRIPTION OF THE DRAWINGS

Figure 1:
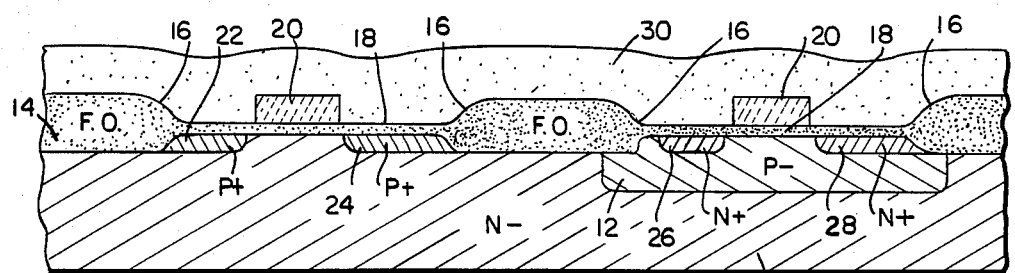
FIG. 1 is a cross-sectional view of an integrated circuit having CMOS devices formed therein.

The structure, as illustrated in FIG. 1, shows an N− substrate 10 having a P− well 12 therein and field oxide 14, although an N well may be formed in a P− substrate. The field oxide 14 is formed by applying an oxide inhibiting mask, for example, silicon nitride, in the regions where the N and P channel MOS devices are to be formed and subjecting the wafer to an oxidizing atmosphere. As is well known in the process, the edge of the field oxide adjacent to the edge of the mask produces a tapered edge 16. It should be noted that the P− well 12 may be formed before or after local oxidation depending upon the particular CMOS sequence. The CMOS devices also include an insulative layer 18 extending across between the field oxide region 14 and a gate layer 20. P+ source and drain regions 22 and 24 are formed in the N− substrate 10 aligned with the edge of the field oxide 14 and N+ source and drain regions 26 and 28 are formed in the P− well 12 also aligned with the edge of the field oxide 16. Depending upon the process used, the inside edge of the source and drain regions 22, 24, 26 and 28 may be self-aligned with the gate 20 depending upon whether the gate is formed first or subsequent to the formation of the source and drain regions. Again, this is a function of the particular process being used. The wafer is then covered by a dielectric layer 30.

For high performance CMOS devices, the field oxide 14 has depth from the surface of the wafer at least the depth of the source and drain regions 22, 24, 26 and 28. This allows lateral isolation by the field oxide to permit greater density. Also, as discussed in the background of the invention, the shallow source and drain regions 22, 24, 26 and 28 also add to the high performance characteristic of the device. A typical example of impurity concentration and depths include an N− substrate 10 having impurity concentrations of $10^{15}$ atoms per cubic centimeter, a P− well 12 having impurity concentrations of $10^{16}$ atoms per cubic centimeter and a depth of approximately 3 microns. The P+ source and drain regions 22 and 24 have an impurity concentration in the range of 2 to $9 \times 10^{19}$ atoms per cubic centimeter and a depth of approximately 0.5 microns and the N+ source and drain regions 26, 28 have an impurity concentration range of 1 to $2 \times 10^{20}$ atoms per cubic centimeter and a depth of approximately 0.3 microns. The field oxide has a depth of 0.5 microns from the surface of the substrate. The insulative layer 18 may have a thickness in the range of 0.03 to 0.04 microns and the gate material 20 which may be a metal or polycrystalline silicon having a thickness of 0.4 microns.

Figure 4:
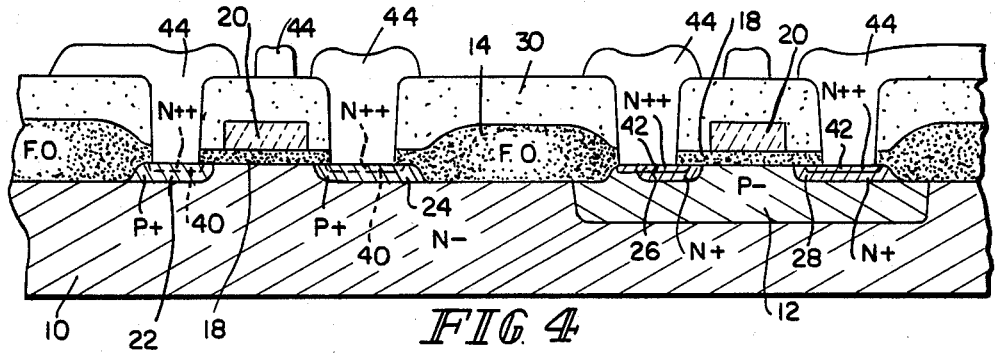
FIG. 4 is a cross-sectional view of a CMOS integrated circuit after application and delineation of the metal contacts and interconnects.

Following the formation of the dielectric layer 30 which may be a chemically vapor deposed oxide having a thickness of 0.7 microns, contact apertures 32, 34, 36 and 38 formed to expose source and drain regions 22, 24, 26 and 28 respectively. N-type impurities are ion implanted at a very low temperature non-selectively through the apertures 32, 34, 36 and 38. A typical example is an ion implantation of phosphorus with a $6 \times 10^{14}$ centimeter squared dose at an energy level of 80 KeV. The impurities are low temperature activated at a temperature in the range of 700° to 950° for approximately one hour. This step is illustrated in FIG. 2 and produces a very shallow impurity concentration region having a depth of approximately 0.1 micron and is illustrated in FIG. 4 as regions 40 in P+ source and drain regions 22 and 24 and N++ regions 42 in N+ source and drain regions 26 and 28.

Figure 2:
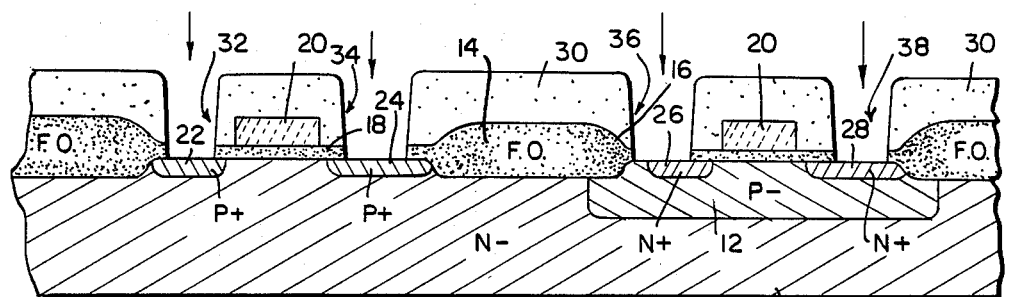
FIG. 2 is a cross-sectional device illustrating the formation of metal contacts to the CMOS devices according to the principles of the present invention.

Since the process is carried out in FIG. 2 nonselectively, the ion implantation step must produce an impurity concentration greater than the P− well 12 from which it is designed to protect shorting to but less than the surface impurity concentration of the P+ source and drain regions 22 and 24. A close examination of the contact aperture 36 indicates that it cuts through the sloping edge 16 of the field oxide 14 and even into the P− well 12. It is this region which is susceptible to being shorted by aluminum metals to the P− well 12. The compensation implantation of the present process provides a low temperature step which assures alignment of the N region with the metal contacts without modifying the operating characteristics of the MOS devices.

It should be noted that, if surface area is not a limitation, the source and drain regions 26 and 28 may be made large enough to accomodate any alignment problem and thus the present process would not be necessary. This process allows the use of source and drains substantially the size of contact aperture.

Figure 3:
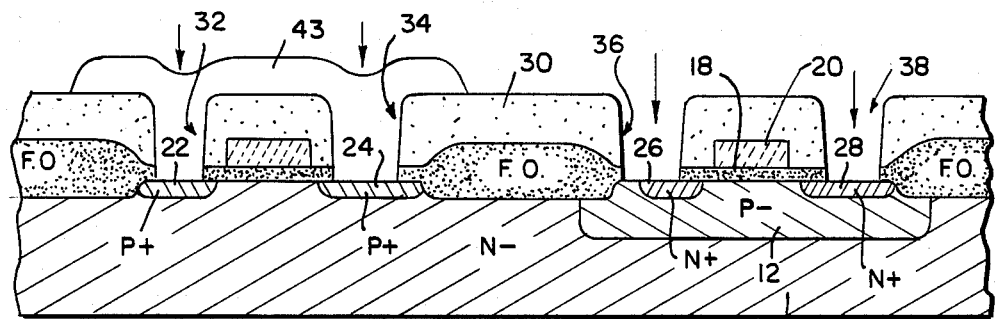
FIG. 3 is a cross-sectional view of the CMOS device using an alternative method according to the principles of the present invention.

Alternative to the non-selective ion implantation of FIG. 2, a selective ion implantation may be performed as illustrated in FIG. 3. For such implantation, a masking layer 43 is applied and delineated. It should be noted that this step should be a low temperature process and since the ion implantation is low energy, various materials may be used, for example, photoresist. The ion implantation is then carried out.

After the ion implantation of FIG. 2 and the removal of the photoresist of FIG. 3, the implant is activated by a low 700°–900° anneal. The interconnect layer 44 is then applied and delineated. As illustrated in FIG. 4, source and drain contacts through apertures 32, 34, 36 and 38 are formed as well as interconnects. Also, gate contacts are formed and delineated through apertures not shown for the sake of clarity. Other than the removal of the photoresist layer 43, there are no intermediate oxidation or etching steps between the ion implantation and the application of the contact layer. Any such intermediate etching will only modify the contact opening and possibly destroy the integrity of the ion implantation compensation step. The interconnect layer 44 is preferably aluminum but may be other metals as well as doped polycrystalline silicon.

From the preceding description of the preferred embodiment, it is evident that the objects of the invention are attained, and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A method of fabricating contacts to CMOS devices having N and P conductivity type source and drain regions in P and N conductivity type body regions respectively of a substrate, a gate oxide layer and gate layer, a field oxide layer on said substrate adjacent said source and drain regions comprising:

forming a dielectric layer covering said substrate;
   removing portions of said dielectric layer to expose contact areas of said source and drain regions;
   ion implanting N type impurities into said contact areas of said N type source and drain regions to form a contact region of a shallower depth than said source and drain regions; and
   applying a layer of conductor material without intermediate etching and delineating to form contacts and interconnects.

2. The method according to claim 1 wherein said P type source and drains are formed to have a higher impurity concentration than said P type body region and said implantation step introduces impurities to have a concentration greater than P type body and less than said P type source and drain regions.

3. The method according to claim 1 including forming a mask layer over said exposed P type source and drain contact areas using a low temperature process prior to implantation and removing said mask layer before applying said conductor material.

4. The method according to claim 1 wherein said conductor material is aluminum.

5. The method according to claim 1 wherein said field oxide is formed by localized oxidation and has depth into the surface of said body regions at least the depth of said source and drain regions.

6. The method according to claim 1 wherein said source and drain regions are formed aligned with the adjacent edge of said field oxide layer.

7. The method according to claim 1 further comprising activating said ion implanted impurities is at a temperature in the range of 700° to 900° Centigrade.

* * * * *